United States Patent [19]
Dillard et al.

[11] 4,315,045
[45] Feb. 9, 1982

[54] CONDITIONING OF POLYAMIDES FOR ELECTROLESS PLATING

[75] Inventors: David A. Dillard, Diamond Bar; Eileen Maguire, Arcadia; Lawrence P. Donovan, Temple City, all of Calif.

[73] Assignee: Crown City Plating Co., El Monte, Calif.

[21] Appl. No.: 159,585

[22] Filed: Jun. 16, 1980

Related U.S. Application Data

[63] Continuation-in-part of Ser. No. 970,923, Dec. 19, 1978, abandoned.

[51] Int. Cl.³ .............................................. B05D 3/10
[52] U.S. Cl. .................................... 427/307; 156/628; 156/668; 427/304; 427/305; 427/306; 427/444
[58] Field of Search ................................ 427/304–307; 156/628, 668; 427/444

[56] References Cited

U.S. PATENT DOCUMENTS

| 3,574,070 | 4/1971 | Sahely | 156/628 |
| 3,686,017 | 8/1972 | Menikheim et al. | |
| 4,084,023 | 4/1978 | Dafter | 427/306 |
| 4,125,649 | 11/1978 | Donovan | 427/307 |
| 4,131,698 | 12/1978 | Deckert | 427/307 |

FOREIGN PATENT DOCUMENTS

| 551820 | 3/1943 | United Kingdom . |
| 626380 | 7/1949 | United Kingdom . |
| 896606 | 5/1962 | United Kingdom . |
| 1015273 | 12/1965 | United Kingdom . |
| 1310306 | 3/1973 | United Kingdom . |

Primary Examiner—Michael R. Lusignan
Assistant Examiner—Janyce A. Bell
Attorney, Agent, or Firm—Christie, Parker & Hale

[57] ABSTRACT

Polyamide substrates are pre-conditioned for electroless plating by contact with an alkaline aqueous solution having a pH of at least about 10 and etched with an aqueous acid etch solution. The aqueous acid etch solution is preferably an aqueous solution of an organic acid containing at least two carbon atoms, particularly an acetic acid compound, such as trichloroacetic acid.

48 Claims, 26 Drawing Figures

CONDITIONING OF POLYAMIDES FOR ELECTROLESS PLATING

CROSS-REFERENCE TO RELATED APPLICATIONS

This application is a continuation-in-part of Application Ser. No. 970,923, filed Dec. 19, 1978, now abandoned.

BACKGROUND OF THE INVENTION

The present invention relates to electroless plating of polyamides, in particular, to providing a surface uniformly receptive to metals which catalyze electroless deposition of nickel and copper.

The benefits of electroless plated, non-conductive articles, particularly plastic articles, are well known. In the finished product, the desirable characteristics of the plastic and the metal are combined to offer thereby the technical and aesthetic advantages of each.

Polymeric substrates are conventionally plated by pre-conditioning the surface by contact with an aqueous solution of at least one organic compound active for "conditioning" or "pre-etching" the surface of the plastic, etching with a strong oxidizing acid or base, seeding the surface with a noble metal catalyst, e.g., a palladium chloride solution, then immersing the seeded surface in an autocatalytic electroless plating solution where an initial coating of a conductive metal, e.g. copper or nickel, is established by chemical deposition. The metal deposit acts as a buss to allow a thicker coating of metal to be built up electrolytically.

Attempts to adapt conventional procedures for electroless plating of polymers to polyamides by us have resulted in a failure to achieve a uniform adherent coat of metal. Having found conventional electroless plating procedures ineffective, a quest was initiated to discover a procedure to enable uniform coating of polyamides with electroless deposited metals.

SUMMARY OF THE INVENTION

It has now been found that electroless plating of polyamides, particularly filled polyamides, can be enhanced by first contacting the polyamide substrate with an aqueous alkaline conditioning solution having a pH of at least about 10, preferably a solution of at least one alkali metal hydroxide in which the alkali metal hydroxide content is from about 2 percent by weight to solution saturation, more preferably from about 10 to about 50 percent by weight. The alkaline conditioning solution is maintained at a temperature from about 150° F. to the lesser of the boiling point of the solution and the softening point of the polyamide substrate. Contact is for a time sufficient to enable etching by an aqueous acid etch solution.

The substrate is then contacted with an aqueous acid etch solution at ambient temperature or above. The concentration of the acid is sufficient to render the polyamide surface uniformly receptive to seeding by a metal catalyst and, for at least filled polyamides, microporous. The micropores provide anchor sites for securement of the electroless plate. A preferred aqueous acid etch solution is a solution comprising at least one organic acid containing from two carbon atoms to about 10 carbon atoms and having a solubility in water of at least about 3 percent by weight of solution.

The presently preferred aqueous etch solutions are solutions comprising at least one acetic acid compound of the formula:

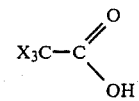

wherein each X is independently selected from the group consisting of hydrogen, hydroxyl and halogen. Trichloroacetic acid is partially preferred.

Contact with the aqueous acid etch solution may be directly followed by seeding the surface with a metal electroless plating catalyst which are solutions of metal ions or suspensions of metal particles.

Following seeding and activation of the metal catalyst by conventional means, the surface can be uniformly plated with electroless copper or nickel.

Etching may be followed by rinsing debris from the surface of the substrate with an acid to alkaline rinse solution.

Alkaline rinses are preferred, as even the use of the aqueous alkaline conditioning solution will not detract from the etch provided. More care must be taken in selection of the acid rinse. A strongly acid solution can degradably attack the polyamide and destroy the etch. In general, the acid should be less than about 4 N and preferably less than 3.5 N.

In carrying out the process of this invention in its preferred embodiment, an alkali metal hydroxide solution is used as the aqueous alkaline conditioning solution and is preferably employed at a temperature from about 170° to about 200° F. at contact times ranging from about 0.5 to about 20 minutes or more, depending on temperature and caustic concentration. No damage has been found from prolonged contact.

Contact time in the aqueous acid etch solution is normally from about 10 seconds to 15 minutes at room temperature, preferably from about 0.25 to about 3 minutes. When, as is presently preferred, a solution of an acetic acid compound is employed for etching the substrate, concentration is normally at least about 3 percent by weight up to solution saturation preferably from about 5 to about 60 percent by weight.

In conducting the process of the invention, the article may be treated by contacting the article in an aqueous solution of an organic solvent for the polyamide, prior to or following contact with the aqueous alkaline conditioning solution. Alternately, the organic solvent can be contained in the aqueous alkaline conditioning solution. The solvent in its solution is normally employed in a concentration up to about 5 percent by weight, preferably up to about 1 percent by weight. Ethylene glycol, phenolic compounds such as chlorophenol, cresols and salts thereof are presently preferred. As indicated, the solvent may be contained in its own bath or included in the alkaline conditioning solution so long as the organic solvent is not hydrolyzed or degraded. The solvent serves to soften the plastic to aid etch by the acid employed for etch, but does not serve an etch function.

As indicated, the substrate after etching may be further processed to remove the debris of etching by contact with acidic to basic wash.

DRAWINGS

DETAILED DESCRIPTION

Figure 1A:
FIG. 1 is a series of surface photographs taken using a scanning electron microscope, illustrating the effect of various surface treatments on a filled Nylon 6,6 known as Vydyne TM RP-260.

According to the present invention, there is provided a process which enables uniform electroless deposition of metals onto polyamide substrates.

In particular, the processes of the present invention are directed to improvements in electroless plating of filled and unfilled polyamides such as Nylon 6 and Nylon 6,6.

In its broadest aspects, the invention provides a process of contacting the surface of a polyamide substrate with an aqueous alkaline conditioning solution having a pH of at least about 10 at a temperature from about 150° F. to the lesser of the boiling point of the aqueous alkaline conditioning solution and the softening point of the polyamide followed by the etching of the conditioned surface with an aqueous acid etch solution capable of rendering the surface of the polyamide substrate, without further surface treatment, directly receptive to an electroless plating catalyst, and as to at least filled polyamides, microporous.

Although solutions of alkali metal hydroxide are preferably employed as the aqueous alkaline conditioning solution, there may also be used alkaline compounds such as sodium metasilicate, trisodium phosphate, sodium carbonate and the like, used alone, in admixture and/or in combination with an alkali metal hydroxide.

When a conditioning solution of at least one alkali metal hydroxide is employed, the solution has an alkali metal hydroxide content of from about 2 percent by weight of solution to solution saturation, preferably about 10 to about 50 percent by weight.

The aqueous alkaline conditioning solutions are, as presently employed, maintained at a temperature from about 150° F. to the lesser of the boiling point of the solution and the softening temperature of the polyamide, preferably from about 170° to about 200° F.

Contact is for a time sufficient to render the substrate receptive to attack by the acid etch; and after rinsing, is followed by contact of the polyamide substance with an aqueous acid etch solution. The preferred aqueous acid etch solutions are solutions comprising at least one soluble organic acid containing at least two carbon atoms, and contact is for a time sufficient to render the surface uniformly receptive to a metal catalyst, and as to at least filled polyamides, microporous. The metal catalyst may be in the form of a solution of functional metal ions or as a dispersion of metal particles. It is presently preferred that the organic acid be an acetic acid compound as defined below.

As part of the process measures, water rinsing with deionized water is performed for good housekeeping between each step. The substrate may be treated with a dilute solution of solvent for the polyamide to soften the surface of the polyamide to promote the etch, but without serving an etch function. Contact with the solvent may be prior to or after contact with the aqueous alkaline conditioning solution or contained in the aqueous alkaline conditioning solution. It is presently preferred to contact the substrate with the solvent following contact with the aqueous alkaline conditioning solution. If desired, a solution of the solvent may be employed prior to and following contact with the alkaline conditioner. The solvent softens the surface of the substrate to promote etching, but does not in itself serve an etch function.

The substrate may be contacted with an acid to basic solution subsequent to etch to remove debris present on the surface of the substrate prior to surface activation with a catalyst. A basic solution is preferred, as basic solutions do not degrade the surface of the polyamide. Acid solutions, by contrast if too strong, will degrade the surface and remove the micropores provided by a functional aqueous acid etch solution. It has been observed that surface degradation of filled polyamides will occur for strong acids at concentrations of 4 N or less. Although dependent on the polyamide itself and strength of the acid, it is generally desirable to avoid the use of acids at a concentration above about 4 N. Preferably, acid concentration should be less than 3.5 N. This criteria may also be used in selecting acid concentration for the aqueous acid etch solution.

While reception of electroless plating onto the surface of any polyamide may be enhanced, the polyamides to be normally treated are filled polyamides as are conventionally used in molding operations. Typical of such materials are filled Nylon 6, Nylon 6,6 and the like.

The first essential step of the process is contacting the polyamide substrate with an aqueous alkaline conditioning solution. The presently preferred solutions are solutions of at least one alkali metal hydroxide, such as sodium and/or potassium hydroxide, present in a concentration from about 3 percent by weight of solution to solution saturation, preferably from about 10 to about 50 percent by weight. Solution temperature is maintained from about 150° F. to the lesser of the boiling point of the solution and the softening temperature of the polyamide substrate, preferably from a temperature of about 170° to about 200° F.

Contact time may vary from about 0.5 to 20 minutes or more, depending upon temperature and the alkaline compound concentration, although it has been found that prolonged immersion will not damage the substrate. The object is to condition the surface of the substrate to make it receptive to attack by the aqueous acid etch solution.

Following water rinsing to remove the alkaline conditioning solution, the article is passed to an aqueous acid etch solution capable of rendering the conditioned surface directly receptive to an electroless plating catalyst and, if a filled nylon, microporous to provide anchor sites for the deposited plate. The aqueous acid etch solution is preferably one based on organic acids containing from 2 to about 10 carbon atoms and having a water solubility of at least about 3 percent by weight of solution. The presently preferred etch is one comprising from about 5 percent by weight to about 60 percent by weight of solution and more preferably, from about 10 to about 25 percent by weight of solution of at least one acetic compound of the formula:

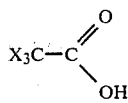

where each X is independently hydroxyl, hydrogen or halogen, with halogen preferred.

Contact is normally at ambient or room temperature although elevated temperatures may be employed. Contact times range from about 10 seconds to 15 minutes or more and are for a time sufficient to etch the surface of the polyamide to a degree that it becomes uniformly receptive to seeding by a metal catalyst. Filled nylons are rendered microporous. The micropores act as anchor sites for the electroless deposited metal, either copper or nickel, which serves as a buss for application of an electrolytic plate. A preferred contact time is from about 0.25 to about 3 minutes.

Among the acetic acid compounds which may be used there may be mentioned trichloroacetic acid, acetic acid, hydroxyacetic acid, dichloroacetic acid, chloroacetic acid, fluoroacetic acid, difluoroacetic acid, trifluoroacetic acid, bromoacetic acid, dibromoacetic acid and the like. Trichloroacetic acid is presently preferred.

Although several of the above acids are solvents for polyamides, they do not play a solvent function in the process. Rather, their prime role is to create, expecially for filled polyamides, surface micropores which serve as anchor sites for the deposited plate. To this end, exposure time to the acid should be minimized to retard solvent action, as the acids tend to be absorbed by the surface and induce long-term surface softening. This does not detract from bond strength, but if extensive, will form, for a period of time, a soft, easily scored surface.

In summary, in the practice of the invention, the combination of conditioning with the aqueous alkaline conditioning solution and etching with an aqueous acid etch solution is universally applicable to nylon substrates. For Nylon 6, contact with the aqueous alkaline conditioning solution is a desirable, but optional, step.

There may be employed as part of the process, contact with an organic solvent for the polyamide, if softening without etch is desired. The solvent may be in a separate bath used preceding and/or following the alkaline conditioning solution or included in the alkaline conditioning solution. The organic solvent softens the surface of the substrate to aid attack by the aqueous acid etch solution, but does not in itself serve an etch function. Typically, concentration of the solvent in its solution is up to about 5 percent by weight, preferably up to about 1 percent by weight. A wide variety of solvents for polyamides may be used. The presently preferred solvents are ethylene glycol, chlorophenol, cresols and salts thereof. If employed in the alkaline conditioner as its solution, the solvent should not be hydrolyzed or degraded by the aqueous alkaline solution.

In addition, subsequent to contact with the acid etch, the substrate may be brought into contact with an acid to alkaline solution of either an organic or inorganic acid or base to cleanse the surface of debris, i.e., filler and/or degraded resin. Such solutions are normally maintained at room temperature, although elevated temperatures may be employed. Although solutions used as the conditioner may be employed, solutions having an acidic or alkaline compound in concentration in the range up to about 20 percent by weight, preferably up to about 10 percent by weight may also be employed. Functional acids include hydrochloric acid, sulfuric acid, phosphoric acid, nitric acid, formic acid, acetic acid and the like. To prevent surface degradation, acid concentration must be less than about 4 Normal, preferably less than about 3.5 Normal. There may be used as a convenience to minimize the number of baths involved, the alkaline conditioning solution used for conditioning the substrate, as it has been found that the alkaline conditioning solution will not degrade the polyamide. Alternative solutions include such as solutions of borax, ammonium bifluoride and the like. As with the acid, the concentration is that which will enhance surface finish without detracting from the ability of etched surface to accept a metal catalyst.

Whether or not the cleansing treatment is employed, the article is rinsed in water, usually deionized water, and seeded with a metal electroless plating catalyst.

The electroless plating catalysts employed may be noble metal or non-noble metal based. Non-noble metal catalysts are described in U.S. Pat. No. 3,958,048 to the same assignee as this application and incorporated herein by referencing.

A noble metal catalyst in an aqueous medium is presently preferred. By a "noble metal catalyst contained in an aqueous medium" there is meant an ionic solution or colloidal suspension of the free metals. Colloidal suspensions are preferred. The noble metals include gold, platinum and palladium, with palladium preferred.

A suitable ionic bath is one containing palladium chloride in a concentration of about 0.2 grams per liter solution and 3 ml of concentrated hydrochloric acid per liter of solution. Following seeding, the palladium can be reduced to the free metal state by immersion in a bath of a reducing agent such as dimethyl amine borane.

Colloidal suspensions of noble metals are described in U.S. Pat. No. 3,011,920 to C. R. Shipley, Jr., incorporated herein by reference. Such suspensions are colloidal in nature in which the nobel metal colloid is maintained in suspension by a protective colloid, i.e., stannic acid colloids. Following seeding, the colloid is removed by immersion in an acidic or alkaline accelerator solution to remove the protective colloid and expose the absorbed noble metal.

Although less preferred, there may also be employed a seeding method which involves contacting the etched article with a sensitizing solution containing stannous chloride followed by immersion in an activator solution such as a palladium chloride solution where the ionic palladium is reduced to the free metal on the surface of the substrate.

Suitably activated, the article may be electrolessly plated by conventional means. Electroless copper and nickel formulations, such as those described in U.S. Pat. Nos. 3,011,920 and 3,874,072 incorporated herein by reference, may be employed. Electroless copper solutions are typically based on a soluble copper salt, such as copper sulfate, a complexing agent for the cupric ion such as Rochelle salt, an alkali hydroxide for adjustment of pH, a carbonate radical as a buffer and a reducing agent for the cupric ion such as formaldehyde.

Following electroless plating, the substrate may be electrolytically plated by conventional means, with copper, nickel, gold, silver, chromium and the like to provide the desired finish on the article. It has been observed that adhesion will increase with age of the plate.

In the following Examples 1 to 11, and Controls 1 to 9, where the article or substrate was contacted with an aqueous alkaline conditioning solution, the solution was a 35 percent weight to volume aqueous solution of sodium hydroxide maintained at 200° F. (35% NaOH solution). Where contacted with a hydrochloric acid solution, a 28.5 percent (volume by volume) solution of concentrated hydrochloric acid in water was used. The solution of trichloroacetic acid employed was a 20 percent by weight to volume aqueous solution maintained at room temperature (20% TCA solution). Seeding of the etched substrate was with a proprietary colloidal tin-palladium catalyst as described in U.S. Pat. No. 3,011,920 at an acid molarity of about 1.7. An alkaline accelerator was used to expose the palladium metal. The catalyst was maintained at about 120° F. and the accelerator at about 105° F. The electroless copper solution employed was Cuposit TM PM-990 manufactured and sold by the Shipley Company. The electroless copper solution was maintained at ambient temperature.

Following electroless plating, the article was electrolytically plated when possible. In this operation, the substrate was rinsed in deionized water, soaked in an alkaline cleaner, then passed to a reverse current cleaner, an acid dip, bright acid copper and nickel electrolytic plating solutions and finally to a chromium plating solution.

Some plated articles were subjected to cycle testing to determine adhesion performance under thermal stress conditions. In this test the plated article was maintained at a temperature of at least 180° F. for 1 hour, then cooled to room temperature and maintained at room temperature for 30 minutes then cooled to −20° F. and maintained at that temperature for 1 hour.

EXAMPLE 1

A plating grade of filled Nylon 6,6 known as Vydyne TM RP-260, manufactured and sold by the Monsanto Company, was immersed for 10 minutes in the 35% NaOH solution then water rinsed and immersed for 1 minute in the 20% TCA solution. The article was then rinsed in water, catalyzed, rinsed, electrolessly plated with copper and electrolytically plated. Initial plate adhesion ranged from 1.0 to 1.5 lb/in with an average of 1.3 lb/in. The cycle test was successful.

Control 1

The procedure of Example 1 was reversed in that the article was immersed in the 20% TCA solution prior to contact with the 35% NaOH solution. This resulted in skip plating and blistering of the electroless plate.

Control 2

Control 1 was repeated except that immersion time in the 20% TCA solution was increased to 5 minutes. The electrolessly deposited plate blistered.

Control 3

Example 1 was repeated except that immersion in the 20% TCA solution was omitted. This also resulted in blistering of the electroless plate.

EXAMPLE 2

Example 1 was repeated except that the article, after contact with the 20% TCA solution, was reimmersed in the 35% NaOH solution for 10 minutes to cleanse the surface. There was obtained uniform coverage of the electroless and electrolytic plate. Initial adhesion ranged from 1.5 to 1.8 lb/in with an average of 1.7 lb/in. The cycle test was successful.

EXAMPLE 3

Example 1 was repeated except that immersion in the 20% TCA solution was for 2 minutes followed by immersion in the hydrochloric acid solution for 1 minute. The article uniformly plated with electroless copper and was electrolytically plated. Initial adhesion of the plate ranged from 1.3 to 1.8 lb/in with an average of 1.5 lb/in. The cycle test was successful.

Control 4

In this test Example 1 was repeated except that the Vydyne article was immersed in the hydrochloric acid solution for 1 minute, rinsed, then immersed for 1 minute in the 20% TCA solution and again for one minute in the hydrochloric acid solution. Small blisters developed in the electroless plating operation with extensive blistering occurring in the reverse current cleaning step preceding electrolytic plating such that the article could not be electrolytically plated.

Control 5

An article molded of Vydyne TM RP-260 was immersed in the hydrochloric acid solution for 1 minute, rinsed for 1 minute in the 20% TCA solution, followed by 10 minutes in the caustic solution but at a reduced temperature of 160° F. The electroless plate exhibited small blisters, with large blisters occurring in the reverse current cleaner.

EXAMPLE 4

An article molded of Vydyne TM RP-260 was immersed for 10 minutes in the 35% NaOH solution, rinsed, immersed for 1 minute in the 20% TCA solution and for 5 minutes in a cleaner which was a 50 percent volume by volume solution of glacial acetic acid in water at room temperature. The article accepted the electroless and the electrolytic plates. Initial adhesion averaged 1.2 lbs/in.

EXAMPLE 5

An article molded of Capron TM XPN-1030, a filled Nylon 6 manufactured and sold by Allied Chemical Corporation, was immersed in the caustic solution for 10 minutes, rinsed, then immersed in a 10 percent volume by volume solution of dichloroacetic acid for 5 minutes. The article accepted uniform electroless and electrolytic plates.

EXAMPLE 6

Example 5 was repeated except that immersion in the dichloroacetic solution was for 2 minutes at 120° F. The same results were obtained.

EXAMPLE 7

An article molded of Vydyne TM RP-260, following immersion in the alkali hydroxide solution as described in Example 1, was immersed for 15 seconds in a 90 percent aqueous acetic acid solution at room temperature. The etched article accepted an adherent deposit of electroless copper, then adherent electrolytic plates of copper, nickel and chrome.

EXAMPLE 8

The procedure of Example 1 was repeated except that the trichloroacetic acid concentration was reduced to 10 percent by weight to volume. Immersion was for 1 minute. The etched article accepted uniform adherent deposit of electroless copper, an electrolytic plate of copper, nickel then chrome.

EXAMPLE 9

The procedure of Example 8 was repeated except that the polyamide substrate was Capron 1030. The results were equally successful.

EXAMPLE 10

A substrate molded Minlon TM 11-C-40, a nylon manufactured and sold by DuPont, was immersed in a 2 percent by volume solution of cresylic acid in a 5 percent by weight volume aqueous solution of sodium hydroxide, maintained at 130° F. for 5 minutes, then immersed in the alkali hydroxide solution maintained at 200° F. for 10 minutes and for 1 minute in a 15 percent weight by volume aqueous solution of trichloroacetic acid. The etched article accepted upon catalyzation a uniform electroless plate of copper and an electrolytic plate of copper, nickel then chrome and passed the cycle test. Adhesion ranged from 2 to 3 pounds per inch.

EXAMPLE 11

There was employed an unfilled nylon substrate formed of Capron TM 8202F—Type 6 manufactured and sold by Allied Chemical Corporation. The substrate was contacted with the 35% NaOH solution for 5 minutes at 200° F., then with the 20% TCA solution for 1 minute at ambient temperature, followed by re-contact with the 35% NaOH solution for 5 minutes. The etched substrate accepted uniform electroless and electrolytic plates.

Controls 7 to 9

In tests on Vydyne where contact with the 35% NaOH solution was used for 5 or 10 minutes contact, failures occurred with the organic solutions under the conditions identified below.

| Control | Test Solution (Conc, Temp, Contact Time) | Nature of Failure |
|---|---|---|
| 7 | dichloropropanol (15% v/v), 150° F., 1.5 min.) | Massive blistering in cycle test. |
| 8 | dichloropropanol (15% v/v), 150° F., 1.5 min.) | Blistered severely in reverse current cleaner. |
| 9 | Formic acid (45% v/v, R.T., 1 min.) | Blistered in electroless plating operation. |

Figure 1B:
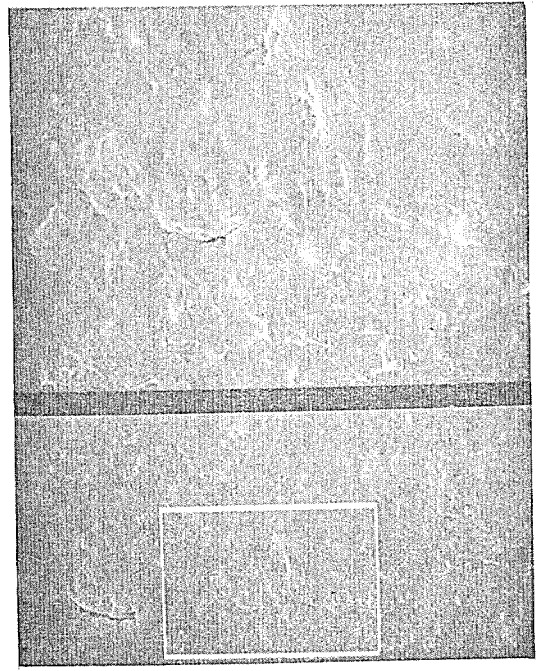
Figure 1C:
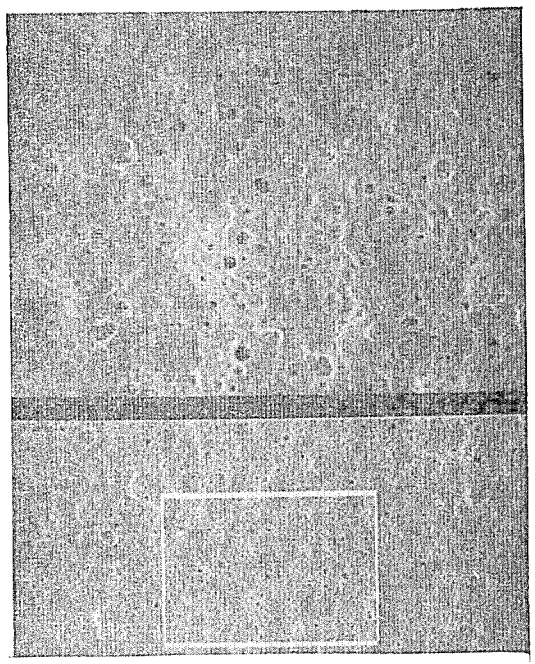
Figure 1D:
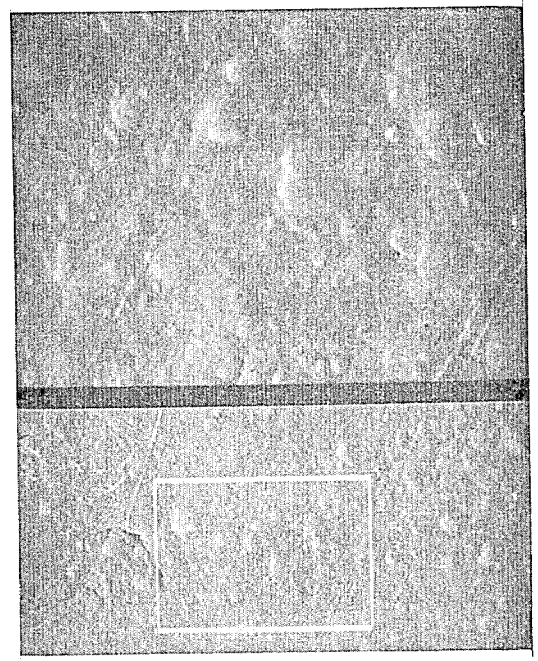
Figure 1E:
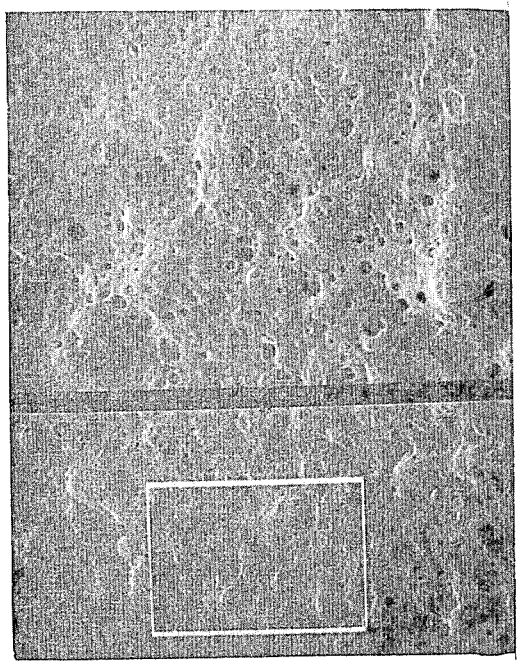
Figure 1F:
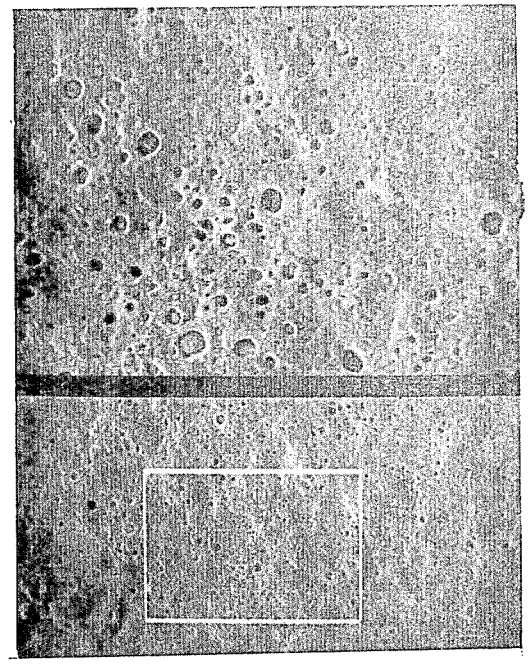
Figure 1G:
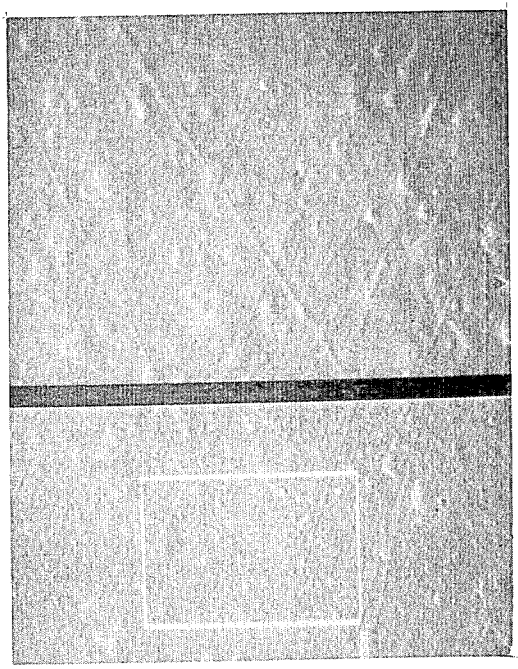
Figure 1H:
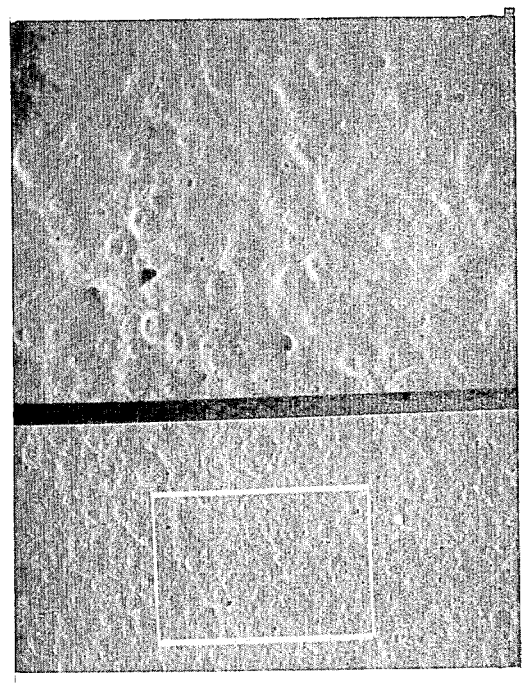
Figure 1I:
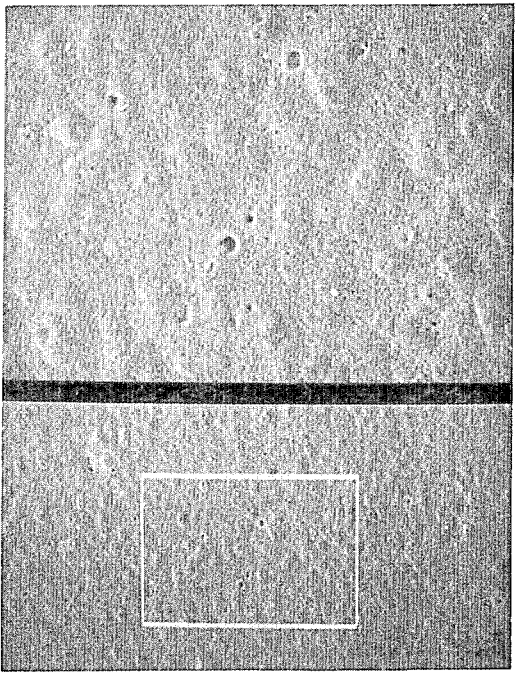
Figure 1J:
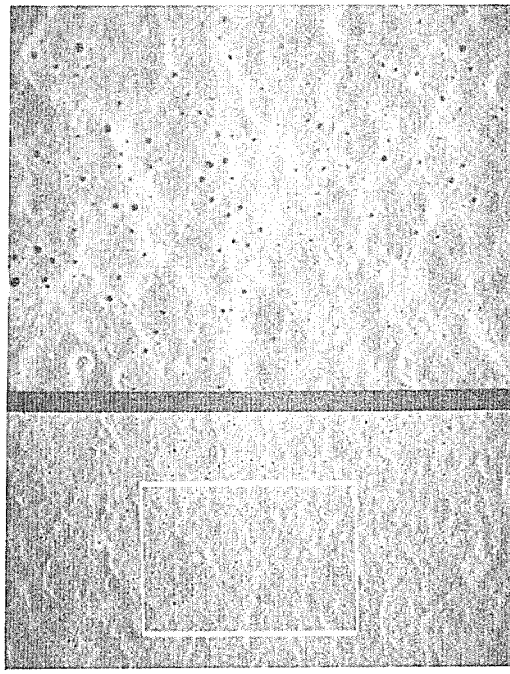
Figure 1K:
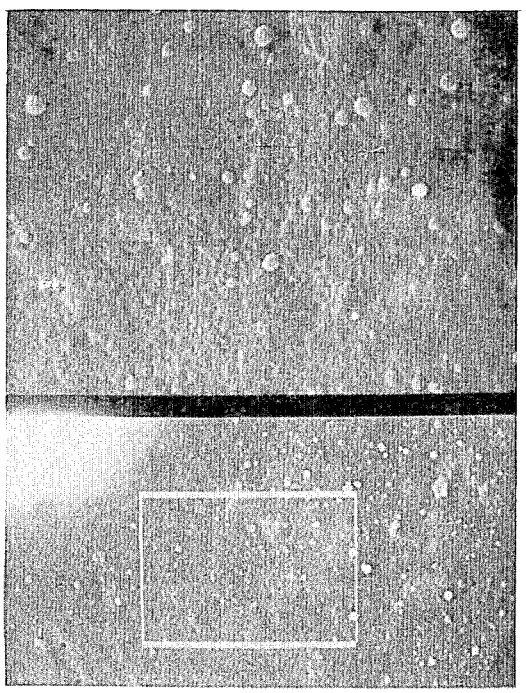
Figure 1L:
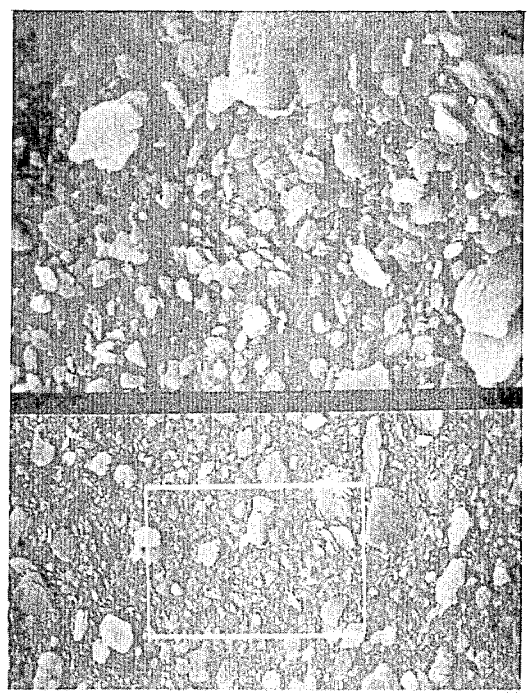
Figure 2A:
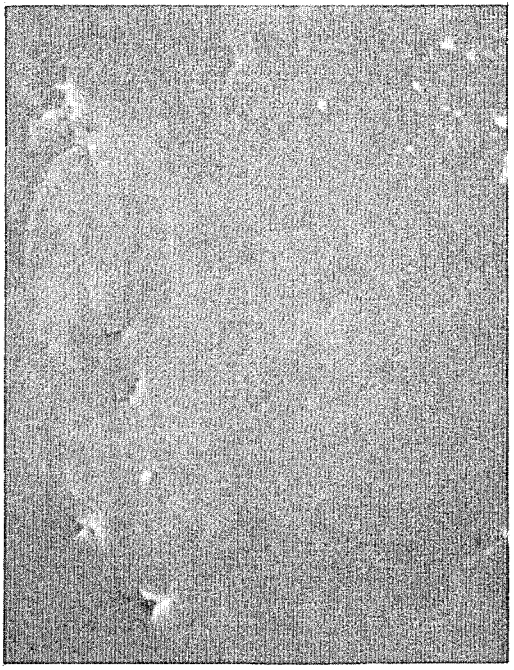
FIGS. 2 and 3 are a series of surface photographs taken using a scanning electron microscope, illustrating the effect of various surface treatments on a filled Nylon 6 known as Capron TM 1030.
Figure 2B:
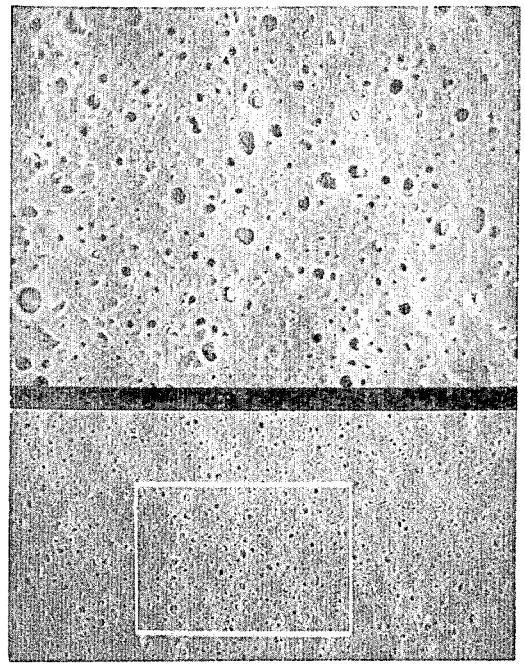
Figure 2C:
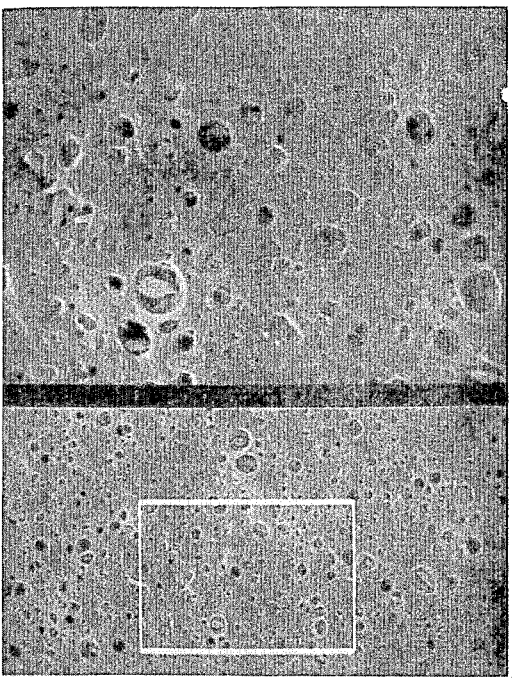
Figure 2D:
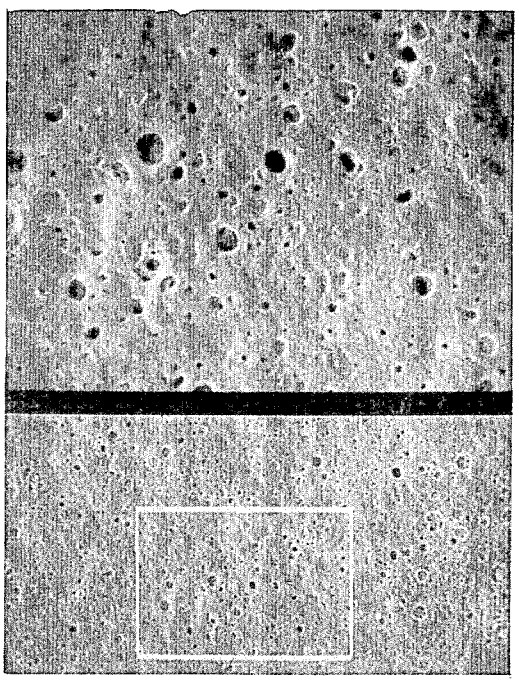
Figure 2E:
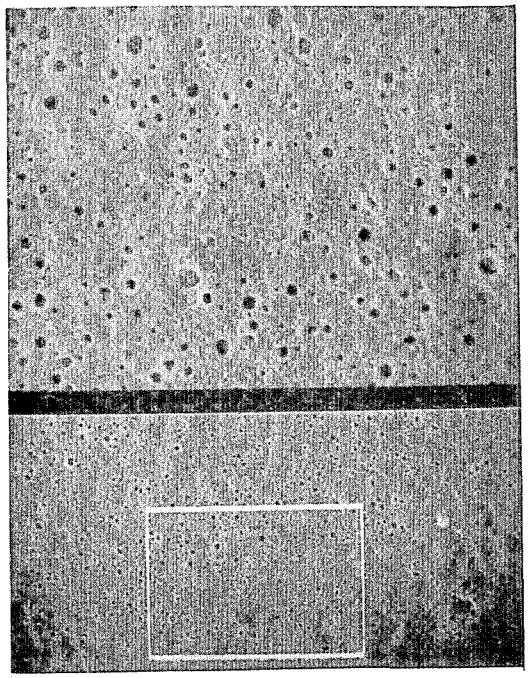
Figure 2F:
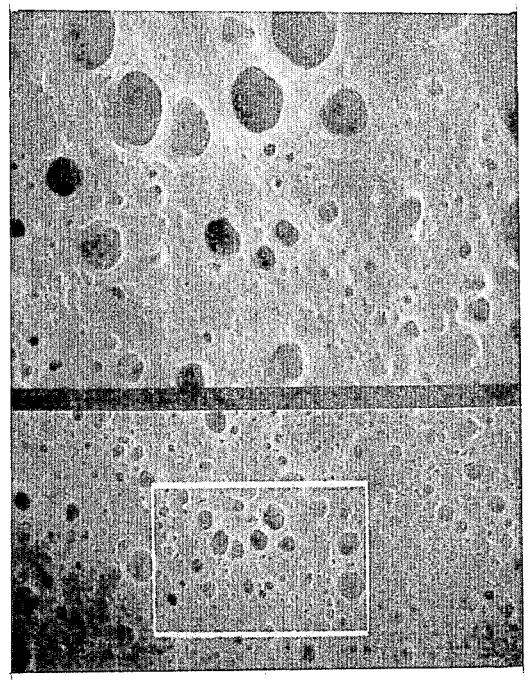
Figure 2G:
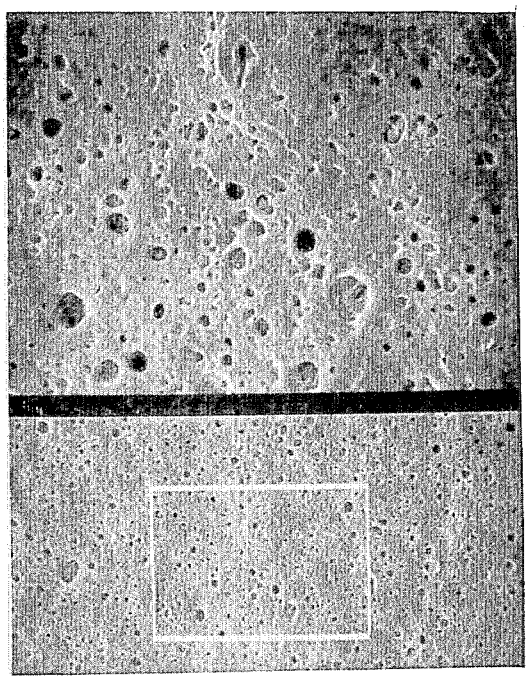
Figure 2H:
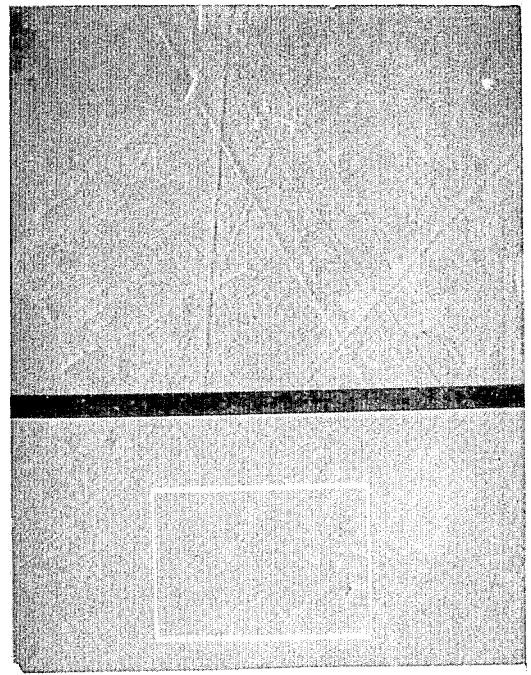
Figure 2:
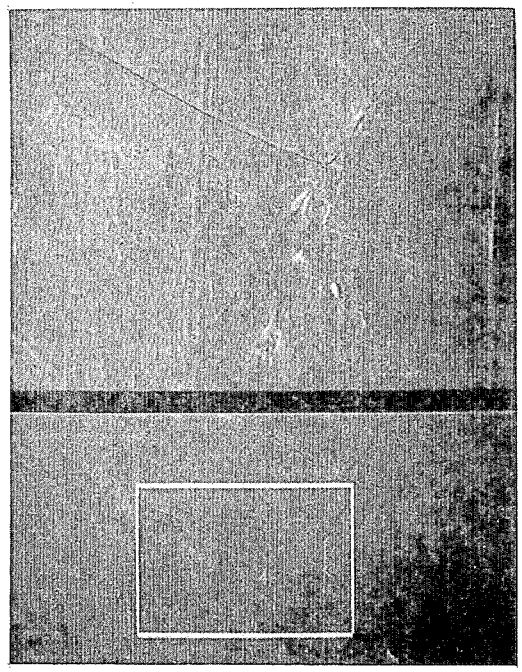
Figure 2:
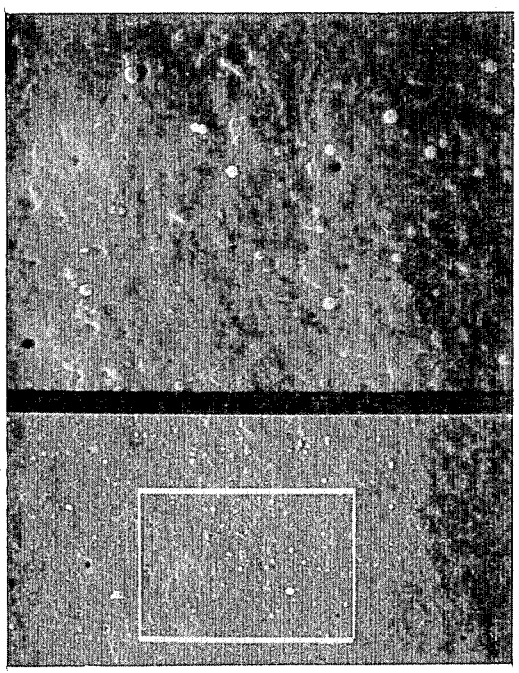
Figure 2:
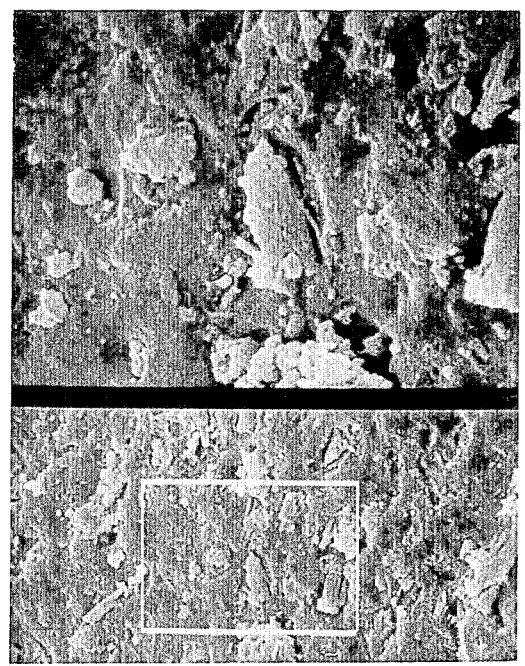

DETAILED DESCRIPTION OF FIGS. 1, 2, and 3

Tests were conducted to illustrate the effect of performing steps useful in the conduct of the invention and adverse to the invention on the surface of articles molded of Nylon 6,6 (Vydyne RP-260) and Nylon 6 or caprolactam (Capron 1030). FIG. 1 pertains to the treatment of Vydyne RP-260, while FIGS. 2 and 3 pertain to the treatment of Capron 1030. For each test, two or a multiplicity of articles were subject to the treatment. Two were removed from each stage of treatment and any remaining passed on to a next stage.

A sample approximately ½ inch square was cut from one article. It was gold sputtered, and the surface was photographed using a scanning electron microscope with the electron beam disposed at an angle of 30 degrees to the sample surface. The companion article was subjected to the plating operation as detailed above. The first step of the plating operation was electroless plating. If no failure occurred, the article was electroplated with copper, nickel, then chrome. If no failure occurred, the article was baked for four hours at 230° F. to normalize the plastic. If no failure occurred, it was heated to 230° F. for one hour, then cooled to −30° F. for one hour (cycle test), and finally, if no failure occurred, to peel testing.

The solutions used in treating the articles were as the aqueous alkaline conditioning solution, a 15% weight-to-volume aqueous solution of sodium hydroxide maintained at 200° F. (15% NaOH solution). As the aqueous acid etch solution there was employed a 15% weight-to-volume aqueous solution of trichloroacetic acid (15% TCA solution) maintained at room temperature. As a solvent solution there was employed a 5% volume-to-volume aqueous room temperature solution of para-chlorophenol (PCP solution). As alternate test solutions, there were employed a 4 Normal aqueous solution of hydrochloric acid (4N. HCL solution); an aqueous chromic acid solution containing 9.5 pounds of chromic acid per gallon of solution and maintained at 150° F., as described in U.S. Pat. No. 3,366,130, and as the formic acid solution a 45% v/v room-temperature (70° F.) solution of formic acid in water.

FIG. 1(a) depicts a molded surface of Vydyne RP-260 magnified 3500 times.

FIG. 1(b) is a split photograph showing the surface after treatment with the 15% NaOH solution and magnified first 1000 times and a scored section magnified 3000 times. The surface displayed a slight degree of puckering, and when processed to attempt to add a plate, blistering occurred during electroless plating with copper.

FIG. 1(c) is illustrative of the invention, and, again at a magnification of 1000× and 3000×, shows the combination of contact with the 15% NaOH solution for 10 minutes and then for 30 seconds in the 15% TCA solution. There are shown the microporous anchor sites developed as a consequence of treatment with the trichloroacetic acid. Appearance of the article after electroplating was excellent, and an adhesion of 4.1 pounds per inch was determined during the peel test.

FIG. 1(d) depicts, at the 1000× and 3000× magnifications, the effect of treatment in the PCP solution for 5 minutes following 10-minute contact with the 15% NaOH solution. While more surface puckering occurred, no anchor sites were developed, and the electroless copper deposit blistered.

If, however, an article after contact with the 15% NaOH solution for 10 minutes, the PCP solution for 5 minutes, and then immersed in the 15% TCA solution for 30 minutes, the anchor sites were developed as shown in FIG. 1(e). Magnification is again 1000× and 3000×. The companion article accepted electrolytic plating to an excellent appearance and provided a peel test of 3.3 lbs/in.

FIG. 1(f) shows the surface after 10 minutes in the 15% NaOH solution, 5 minutes in the PCP solution, 30 seconds in the 15% TCA solution, followed by 5 minutes in the 15% NaOH solution. Using the NaOH solution to rinse the surface had no adverse effect on the surface. A companion article accepted an electrolytic plate to an excellent appearance and provided a peel test of 3.8 lbs/in.

By contrast, when etch in the 15% TCA solution was omitted, namely when the substrate immersed in the 15% NaOH solution for 10 minutes, for 5 minutes in the PCP solution, and again for 5 minutes in the 15% NaOH solution, there resulted as shown in FIG. 1(g) a surface with puckering but with no anchor sites. A companion article blistered during electroless plating.

FIG. 1(h) shows a surface (1000× and 3000×) treated in a duplication of the procedure for FIG. 1(c), except that the 15% NaOH solution was used at approximately 70° F. There was essentially no anchor site development and blistering occurred during electroplating of a companion article.

FIG. 1(i), by contrast, shows a surface contacted with the 15% TCA solution alone for 30 seconds. Again, magnification to 1000× and 3000× shows insufficient development of anchor sites and blistering occurred during electroplating of a companion article.

For FIG. 1(j), contact with the 15% TCA solution only was increased for five minutes. Some additional micropores were developed but were insufficient to prevent blistering during electroplating of a companion article.

FIGS. 1(k) and 1(l) were both preconditioned in the same manner as the substrates for FIG. 1(c), except that for FIG. 1(k) the substrate was rinsed in the 4N. HCl solution for 5 minutes. As shown magnified 1000× and 3000×, no micropores are present and the surface is degraded showing surface debris. A companion article blistered during electroless plating.

FIG. 1(l) shows at 1000× and 3000× the article after immersion for 3 minutes in the chromic acid solution at 150° F. No micropores were present and considerable surface debris remained as a consequence surface degradation. A companion article was subjected to electrolytic plating and gave a poor appearance and blistered during the 4-hour bake.

FIG. 2(a) illustrates the molded surface of Capron 1030 magnified 3500×.

Exposure of 10 minutes to the 15% NaOH solution, then 30 seconds to the 15% TCA solution, gave an electroplated part having a very good appearance and a surface adhesion of 8.0 lbs/in. The exposed plastic surface of a companion article is shown in FIG. 2(b). Magnification is 1000× and 3000×.

When treatment with the trichloroacetic acid was followed with exposure of 5 minutes, using the 15% NaOH solution as a cleanser, the surface appearance, again, was very good, and adhesion was 7.6 lbs/in. FIG. 2(c) shows the condition of the companion substrate with micropores slightly larger than in FIG. 2(b) at the same level of magnification.

As disclosed in co-pending application, Ser. No. 970,929, filed Dec. 19, 1978, incorporated herein by reference, where the polyamide is Nylon 6, treatment with the caustic solution is optional. As shown in FIG. 2(d), the anchor sites were developed even when a room-temperature 15% NaOH solution was employed. Again, magnification is 1000× and 3000×. In this instance, appearance of the companion electroplated article was very good, and adhesion was 6.4 lbs/in.

The use of trichloroacetic acid alone is, for caprolactam, functional to develop microporous anchor sites. FIG. 2(e) shows a surface for exposure for 30 seconds to the 15% TCA solution alone. A companion article electroplated to a bond strength of 7.0 lbs/in., and had a good appearance.

As shown in FIG. 2(f), increasing exposure to 5 minutes appeared to enlarge the size of the holes. The companion electroplated article had a fair electroplate appearance with a soft undersurface and a bond strength of 6.1 lbs/in.

The result of using the PCP solution for 5 minutes as an intermediate step to soften the surface of the plastic is illustrated in FIG. 2(g). Again, as shown at the 1000× and 3000× magnification, there were well developed micropores, and an electroplated companion article had a good appearance and a bond strength of 7.5 lbs/in. Contact with the PCP solution was intermediate of contact for 10 minutes with the 15% NaOH solution and 30 seconds in the 15% TCA solution.

Where, however, there was only exposure for 10 minutes to the 15% NaOH solution and 5 minutes with the PCP solution, there was, as shown in FIG. 2(h), no apparent change in the surface. Magnification was 1000X and 3000X. The plate on a companion article blistered during electroless plating.

Treatment for 10 minutes in the 15% NaOH solution, followed by contact for 5 minutes in the PCP solution, and 5 minutes in the 15% NaOH solution as a cleanser also did not result in an apparent change in the surface, as shown in FIG. 2(ih). Again, the plate on the companion plaque blistered during electroless plating.

As shown in FIG. 2(j), exposure of an article treated for 10 minutes in the 15% NaOH solution and 30 seconds to the 15% TCA solution, and rinsing for 5 minutes in 4N. HCl resulted, as compared to FIG. 2(b), in essential loss of the micropores. An electroplate on a companion article had a very poor appearance and failed during the 4-hour bake.

FIG. 2(k) depicts effects of the chromic acid solution following conditioning for 10 minutes with the 15% NaOH solution and etch in the 15% TCA solution for 30 seconds. The entire surface was degraded.

Figure 3A:
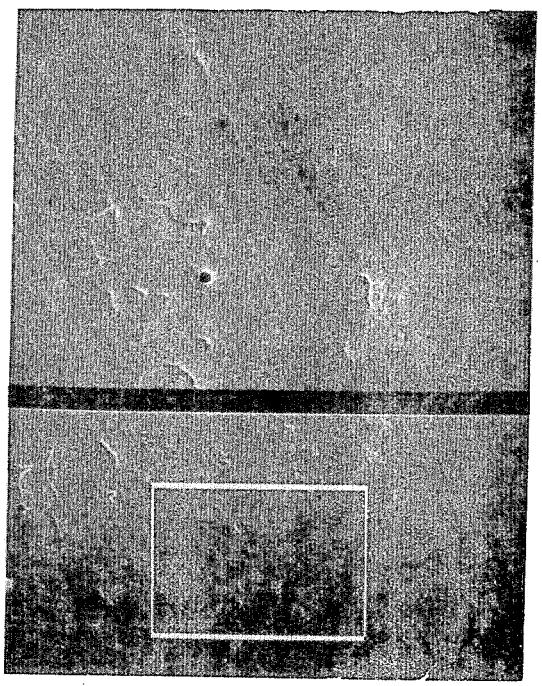
Figure 3B:
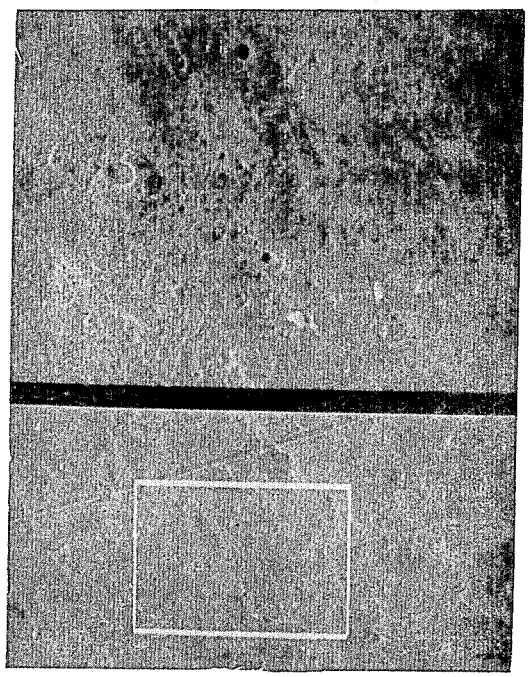
Figure 3C:
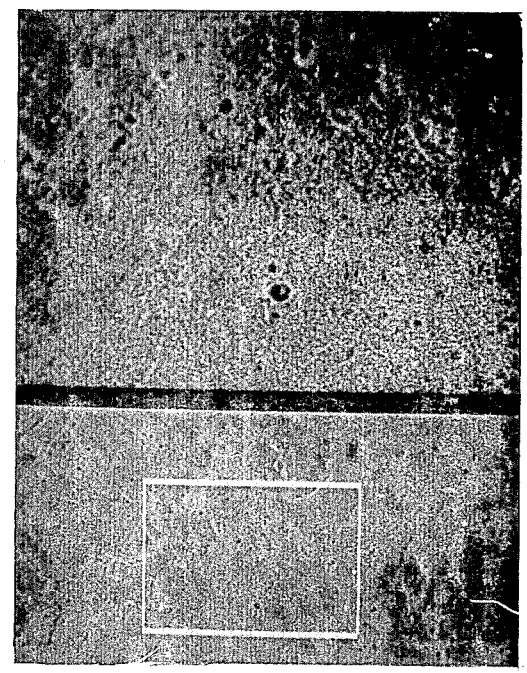

FIGS. 3(a), 3(b), and 3(c) depict at 1000X and 3000X the effect of the formic acid solution on the surface of Capron 1030. As shown in FIG. 3(a), 10 minutes exposure to the 15% NaOH solution, followed by 30 seconds exposure to the formic acid solution, had no effect on the surface. A companion plaque blistered during electroless plating.

Exposure to formic acid alone for 30 seconds, as shown in FIG. 3(b), resulted in some surface erosion, while increasing exposure to 5 minutes resulted in a high degree of erosion of the surface [FIG. 3(c)]. In neither instance did the companion article accept an electroless plate, as blistering occurred during the electroless plating operation.

What is claimed is:

1. A process for electroless plating of polyamide substrates wherein the substrate is etched with an aqueous acid etch solution prior to electroless plating, the improvement which comprises conditioning the substrate prior to contact with the aqueous acid etch solution by contact with an aqueous alkaline conditioning solution having a pH of at least about 10 and maintained at a temperature of from about 150° F. to the lesser of the boiling point of the solution and the softening temperature of the polyamide substrate for a time sufficient to enhance aqueous acid etch of the polyamide substrate to render the conditioned polyamide substrate substantially uniformly and directly receptive to a metal electroless plating catalyst.

2. A process as claimed in claim 1 in which the polyamide substrate is contacted with the aqueous alkaline conditioning solution for a period of time of from about 0.5 to about 20 minutes.

3. A process as claimed in claim 1 in which the polyamide substrate is contacted, prior to contact with the aqueous alkaline conditioning solution, with a dilute aqueous solution of an organic solvent for the polyamide for a time sufficient to soften the surface of the polyamide substrate.

4. A process as claimed in claim 1 in which the polyamide substrate is contacted following contact with the aqueous alkaline conditioning solution, with a dilute aqueous solution of an organic solvent for the polyamide for a time sufficient to soften the surface of the polyamide substrate.

5. A process as claimed in claim 1 in which the conditioning solution contains an organic solvent for the polyamide.

6. A process as claimed in claim 1 in which the polyamide is a filled polyamide.

7. A process for preparing the surface of polyamide substrates for electroless plating which comprises:
(a) forming a conditioned polyamide substrate for etching by contacting the polyamide substrate with an aqueous alkaline conditioning solution having a pH of at least about 10 and maintained at a temperature from about 150° F. to the lesser of the boiling point of the solution and the softening temperature of the polyamide substrate for a time sufficient to render the substrate receptive to etch by an organic acid;
(b) etching the conditioned polyamide substrate by contacting the conditioned polyamide substrate with an aqueous acid etch solution comprising at least one water soluble organic acid containing from 2 to about 10 carbon atoms in the molecule and present in the aqueous solution in a concentration of at least about 3 percent by weight of the solution and sufficient to render the conditioned polyamide substrate substantially uniformly and directly receptive to a metal electroless plating catalyst.

8. A process as claimed in claim 7 in which the polyamide substrate is cleansed prior to contact with the metal catalyst by contact with an aqueous acidic or basic cleansing solution.

9. A process as claimed in claim 7 in which the polyamide substrate is contacted, prior to contact with the conditioning solution, with a dilute aqueous solution of an organic solvent for the polyamide for a time sufficient to soften the surface of the polyamide substrate.

10. A process as claimed in claim 7 in which the polyamide substrate is contacted following contact with the conditioning solution, with a dilute aqueous solution of an organic solvent for the polyamide for a time sufficient to soften the surface of the polyamide substrate.

11. A process as claimed in claim 7 in which the conditioning solution contains an organic solvent for the polyamide.

12. A process as claimed in claim 7 in which the polyamide is a filled polyamide.

13. A process for preparing the surface of polyamide substrates for electroless plating which comprises:
(a) forming a conditioned polyamide substrate for etching by contacting the polyamide substrate with an aqueous alkaline conditioning solution of at least one alkali metal hydroxide in which the alkali metal hydroxide concentration of the aqueous alkaline conditioning solution is from about 2 percent by weight of the solution to solution saturation and maintained at a temperature of from about 150° F. to the lesser of the boiling point of the solution and the softening temperature of the polyamide surface for a time sufficient to render the polyamide substrate receptive to etch by an acetic acid compound;
(b) etching the conditioned polyamide substrate by contacting the conditioned polyamide substrate with an aqueous acid etch solution comprising at least one acetic acid compound having the formula:

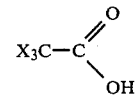

wherein each X is independently selected from the group consisting of hydrogen, hydroxyl and halogen and in which the acetic acid compound concentration is sufficient to render the conditioned polyamide substrate substantially uniformly and directly receptive to a metal electroless plating catalyst.

14. A process as claimed in claim 13 in which the polyamide substrate is cleansed prior to contact with the metal catalyst by contact with an aqueous acidic or basic cleansing solution.

15. A process as claimed in claim 13 in which the polyamide substrate is contacted, prior to contact with the aqueous alkaline conditioning solution, with a dilute aqueous solution of an organic solvent for the polyamide for a time sufficient to soften the surface of the polyamide substrate.

16. A process as claimed in claim 13 in which the polyamide substrate is contacted following contact with the aqueous alkaline conditioning solution, with a dilute aqueous solution of an organic solvent for the polyamide for a time sufficient to soften the surface of the polyamide substrate.

17. A process as claimed in claim 13 in which the aqueous alkaline conditioning solution contains an organic solvent for the polyamide.

18. A process as claimed in claim 17 in which the organic solvent is an alkali soluble organic solvent.

19. A process as claimed in claim 13 in which the polyamide substrate is formed of a filled polyamide.

20. A process as claimed in claim 13 in which the total alkali metal hydroxide content of the conditioning solution is from about 10 to about 50 percent by weight of the solution.

21. A process as claimed in claim 13 in which the aqueous alkaline conditioning solution is maintained at a temperature from about 170° to about 200° F.

22. A process as claimed in claim 13 in which the contact time in the conditioning solution is from about 0.5 to about 20 minutes.

23. A process as claimed in claim 13 in which the total acetic acid compound concentration of the etch solution is from about 3 percent by weight to solution saturation.

24. A process as claimed in claim 13 in which the total acetic acid compound concentration of the aqueous acid etch solution is from about 5 to about 60 percent by weight of the solution.

25. A process as claimed in claim 13 in which the polyamide substrate is contacted with the aqueous acid etch solution for a period of time of from about 10 seconds to about 15 minutes.

26. A process as claimed in claim 13 in which the acetic acid compound is trichloroacetic acid.

27. A process as claimed in claim 13 in which the acetic acid compound is dichloroacetic acid.

28. A process as claimed in claim 13 in which the acetic acid compound is acetic acid.

29. A process for preparing the surface of polyamide substrates for electroless plating which comprises:
 (a) forming a conditioned polyamide substrate by contacting the polyamide substrate with an aqueous alkaline conditioning solution of at least one alkali metal hydroxide in which the total alkali metal hydroxide concentration is from about 10 percent by weight of the solution to solution saturation and maintained at a temperature of from about 150° F. to the lesser of the boiling point of the solution and the softening temperature of the polyamide surface for a period of time of from about 0.5 to about 20 minutes;
 (b) forming an etched polyamide substrate by contacting the conditioned polyamide substrate with an aqueous acid etch solution comprising at least one acetic acid compound selected from the group consisting of trichloroacetic acid, dichloroacetic acid and acetic acid in which the acetic acid compound concentration is sufficient to render the conditioned polyamide substrate substantially uniformly and directly receptive to a metal electroless plating catalyst.

30. A process as claimed in claim 29 in which the polyamide substrate is cleansed prior to contact with the metal catalyst by contact with an aqueous acidic or basic cleansing solution.

31. A process as claimed in claim 29 in which the polyamide substrate is contacted, prior to contact with the aqueous alkaline conditioning solution, with a dilute aqueous solution of an organic solvent for the polyamide for a time sufficient to soften the surface of the polyamide substrate.

32. A process as claimed in claim 29 in which the polyamide substrate is contacted following contact with the aqueous alkaline conditioning solution, with a dilute aqueous solution of an organic solvent for the polyamide for a time sufficient to soften the surface of the polyamide substrate.

33. A process as claimed in claim 29 in which the aqueous alkaline conditioning solution contains an organic solvent for the polyamide.

34. A process as claimed in claim 33 in which the organic solvent is alkali soluble.

35. A process as claimed in claim 29 in which the polyamide substrate is formed of a filled polyamide.

36. A process as claimed in claim 29 in which the total alkali metal hydroxide content of the aqueous alkaline conditioning solution is from 10 to about 50 percent by weight of the solution.

37. A process as claimed in claim 29 in which the aqueous alkaline conditioning solution is maintained at a temperature from about 170° to about 200° F.

38. A process as claimed in claim 29 in which the total acetic acid compound concentration of the aqueous acid etch solution is from about 5 percent by weight of the solution to solution saturation.

39. A process as claimed in claim 29 in which the total acetic acid compound concentration of the aqueous acid etch solution is from about 5 to about 60 percent by weight of the solution.

40. A process as claimed in claim 29 in which the polyamide substrate is contacted with the aqueous acid etch solution for a period of time of from about 10 seconds to about 15 minutes.

41. A process for preparing the surface of filled polyamide substrates for electroless plating which comprises:
 (a) forming a conditioned polyamide substrate by contacting the filled polyamide substrate with an aqueous alkaline conditioning solution of at least one alkali metal hydroxide in which the total alkali metal hydroxide concentration is from about 10 percent by weight of the solution to solution saturation and maintained at a temperature of from about 150° F. to the lesser of the boiling point of the solution and the softening temperature of the polyamide surface for a period of time of from about 10 seconds to about 20 minutes;
 (b) forming an etched polyamide substrate by contacting the conditioned polyamide substrate with an aqueous etch solution comprising trichloroacetic acid, present in a concentration from about 5 percent by weight of solution to solution saturation to render the conditioned filled polyamide substrate uniformly and directly receptive to a metal electroless plating catalyst.

42. A process as claimed in claim 41 in which the polyamide substrate is cleansed prior to contact with the metal catalyst by contact with an aqueous acidic or basic cleansing solution.

43. A process as claimed in claim 41 in which the polyamide substrate is contacted, following contact with the aqueous alkaline conditioning solution, with a dilute aqueous solution of an organic solvent for the polyamide for a time sufficient to soften the surface of the polyamide substrate.

44. A process as claimed in claim 41 in which the total alkali metal hydroxide content of the aqueous alkaline conditioning solution is from 10 to about 50 percent by weight of the aqueous alkaline conditioning solution.

45. A process as claimed in claim 41 in which the aqueous alkaline conditioning solution is maintained at a temperature from about 170° to about 200° F.

46. A process as claimed in claim 41 in which the total trichloroacetic acid concentration of the aqueous acid etch solution is from about 5 to about 60 percent by weight of the aqueous acid etch solution.

47. A process as claimed in claim 41 in which the polyamide substrate is contacted with the aqueous acid etch solution for a period of time of from about 10 seconds to about 15 minutes.

48. A process as claimed in claim 41 in which the polyamide substrate is contacted with the aqueous acid etch solution for a period of time from about 0.25 to about 3 minutes.

* * * * *